(12) United States Patent

Maloney et al.

(10) Patent No.: US 7,847,317 B2
(45) Date of Patent: Dec. 7, 2010

(54) LOW-CAPACITANCE ELECTROSTATIC DISCHARGE PROTECTION DIODES

(75) Inventors: Timothy J. Maloney, Palo Alto, CA (US); Steven S. Poon, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 1979 days.

(21) Appl. No.: 10/335,008

(22) Filed: Dec. 31, 2002

(65) Prior Publication Data

US 2004/0124473 A1   Jul. 1, 2004

(51) Int. Cl.
H01L 29/74 (2006.01)
H01L 31/111 (2006.01)
H01L 29/76 (2006.01)
H01L 29/94 (2006.01)
H01L 31/062 (2006.01)
H01L 23/62 (2006.01)
H01L 29/00 (2006.01)
H01L 25/00 (2006.01)
H02M 7/162 (2006.01)

(52) U.S. Cl. .................. 257/173; 257/328; 257/355; 257/546; 257/E31.005; 327/565; 327/586

(58) Field of Classification Search .................. 257/173, 257/328, 355, 546, E31.005; 327/565, 586
See application file for complete search history.

(56) References Cited

U.S. PATENT DOCUMENTS

| 3,396,317 | A | | 8/1968 | Vendelin |
| 5,455,436 | A | * | 10/1995 | Cheng ..................... 257/356 |
| 5,923,079 | A | | 7/1999 | Narita |
| 6,177,298 | B1 | * | 1/2001 | Quigley ..................... 438/135 |
| 6,518,604 | B1 | | 2/2003 | Worley et al. |
| 2002/0130390 | A1 | * | 9/2002 | Ker et al. ..................... 257/546 |

FOREIGN PATENT DOCUMENTS

EP   0 697 733 A   2/1996

OTHER PUBLICATIONS

Richier, C. et al., "Investigation on Different ESD Protection Strategies Devoted to 3.3V RF Applications (2 Ghz) in a 0.18um CMOS Process", Proceedings of the 22$^{nd}$ Annual EOS/ESD Symposium, pp. 251-259, Anaheim, CA (Sep. 24-28, 2000).

(Continued)

Primary Examiner—David S Blum
(74) Attorney, Agent, or Firm—Blakely, Sokoloff, Taylor & Zafman LLP

(57) ABSTRACT

A reduced capacitance diode. A first conductive layer provides conductive interconnects for pad and supply diffusion regions in a diode. A second conductive layer includes a first portion to couple the pad diffusion regions to a pad and a second portion to couple the supply diffusion regions to a voltage supply. Lines of the first and second conductive layers are substantially parallel to each other in a diode region of the diode. Further, for one aspect, a tap for the diode to be coupled to a supply is wider than a minimum width.

7 Claims, 6 Drawing Sheets

OTHER PUBLICATIONS

Worley, Eugene R. at al., "Optimization of Input Protection Diode for High Speed Applications", Proceedings of the 24$^{th}$ Annual EOS/ESD Symposium, pp. 62-72, Charlotte, NC (Oct. 6-10, 2002).
"International Search Report", International Application No. PCTUS0339159, P14234PCT, mailed Jun. 23, 2004, 5 pages.
Dally, William J., "Digital Systems Engineering", Cambridge University Press, Library of Congress Cataloging-in-Publication Data, (1998), pp. 158-159.
JPO, "First Office Action", Japanese Application No. 2004-565301, Mailed Jun. 23, 2009, 4 pages.

* cited by examiner

LOW-CAPACITANCE ELECTROSTATIC DISCHARGE PROTECTION DIODES

BACKGROUND

An embodiment of the present invention relates to the field of integrated circuits, and, more particularly, to diodes for electrostatic discharge (ESD) protection.

Integrated circuit inputs are frequently protected against ESD by dual diodes D1 and D2 as shown in FIG. 1. The diodes D1 and D2 are set up as shown so that one or the other will forward bias, nondestructively, and keep the voltage of the signal that is provided to an input buffer 105, low enough to avoid damaging the input buffer. As shown, if the polarity of an ESD event is positive, the diode D2 will route the current associated with the ESD event to the supply voltage Vcc and if the polarity of the ESD event is negative, the diode D1 will route the current to Vss.

Currently, the layouts for protection diodes such as D1 and D2 of FIG. 1 have been designed to maximize the efficiency of the diodes as conductors of ESD current. This typically means full metallization and contacting of diode stripes, locating p+ and n+ diode stripes as near as possible to each other, and generous use of vertical metal 2 (M2) (or other higher level metal layer) to connect the horizontal metal 1 (M1) (or lower level metal layer) together to reduce the series resistance of the diodes as shown in an exemplary layout of FIG. 2. A typical goal of the diode layout is to maximize the density of the diode stripes to achieve high ESD protection per unit area.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for reducing the capacitance of electrostatic discharge protection (ESD) diodes are described. In the following description, particular circuits, metal layers and fabrication processes are described for purposes of illustration. It will be appreciated, however, that other embodiments are applicable to other types of circuits, metal layers and/or other fabrication processes.

For one aspect, a diode includes a first metal layer to provide conductive interconnects for pad and supply diffusion regions in the diode and a second metal layer including a first portion to couple the pad diffusion regions to a pad and a second portion to couple the supply diffusion regions to a voltage supply. Lines of the first and second metal layers are substantially parallel to each other in a diode region of the diode. In this manner, capacitance of the diode may be reduced as compared to prior diodes that provide a substantially similar electrostatic discharge protection (ESD) per unit area.

Diode capacitance has not been a significant issue in ESD protection in the past. With rising signal speeds, however, managing diode capacitance is becoming increasingly important. Capacitance budgets are being applied to some integrated circuit inputs and outputs and this trend is expected to increase. With this in mind, added to the goal of achieving high density while maximizing ESD protection as discussed above, is ensuring that ESD protection circuitry remains within a capacitance budget.

Figure 1:
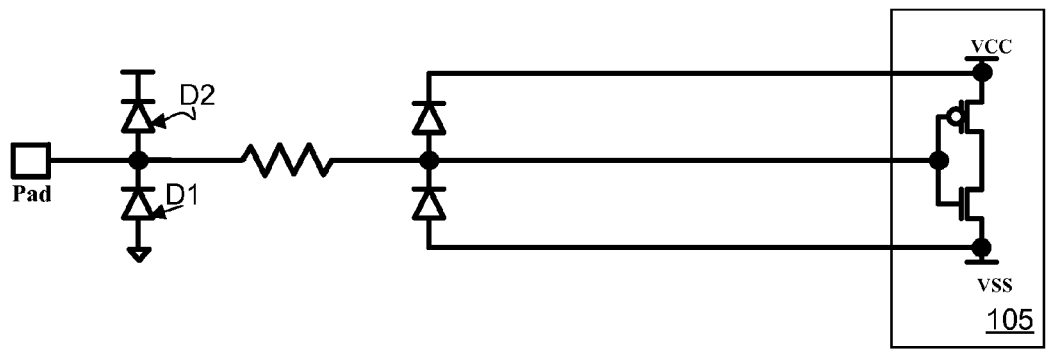
FIG. 1 is a schematic diagram of a prior dual-diode electrostatic discharge (ESD) protection scheme.
Figure 2:
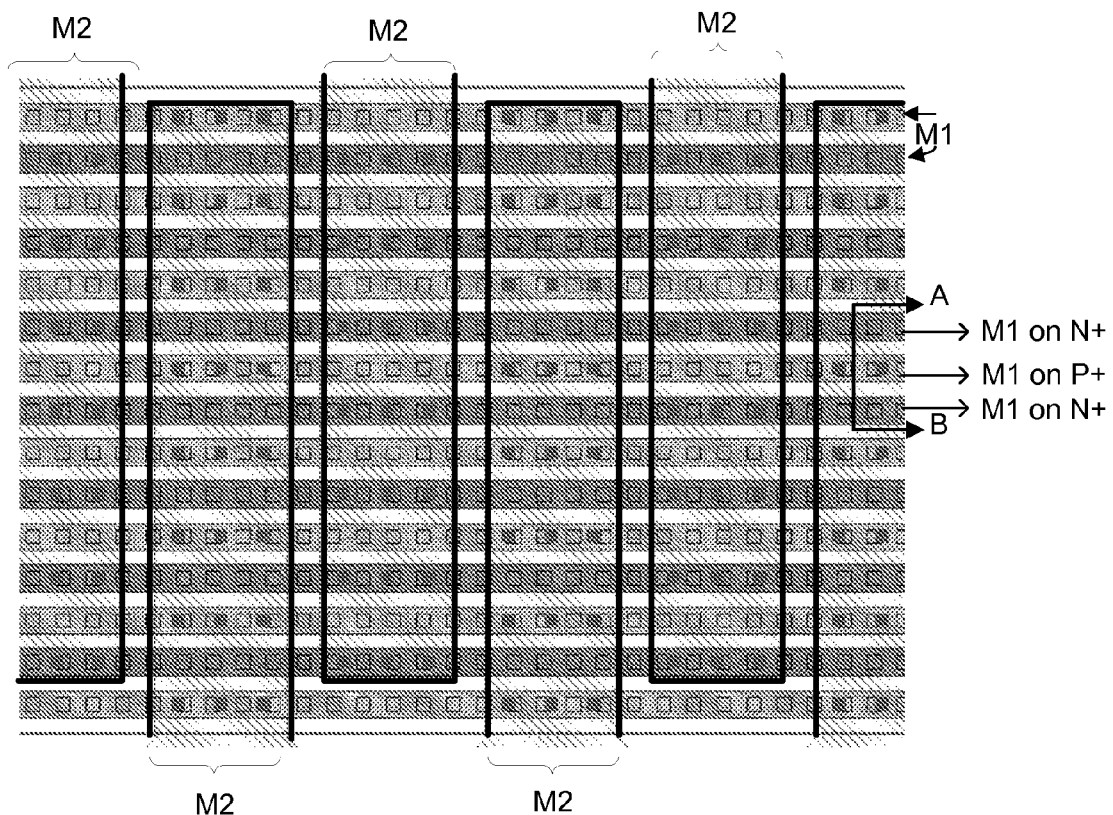
FIG. 2 is a plan view of an exemplary prior diode layout.
Figure 3:
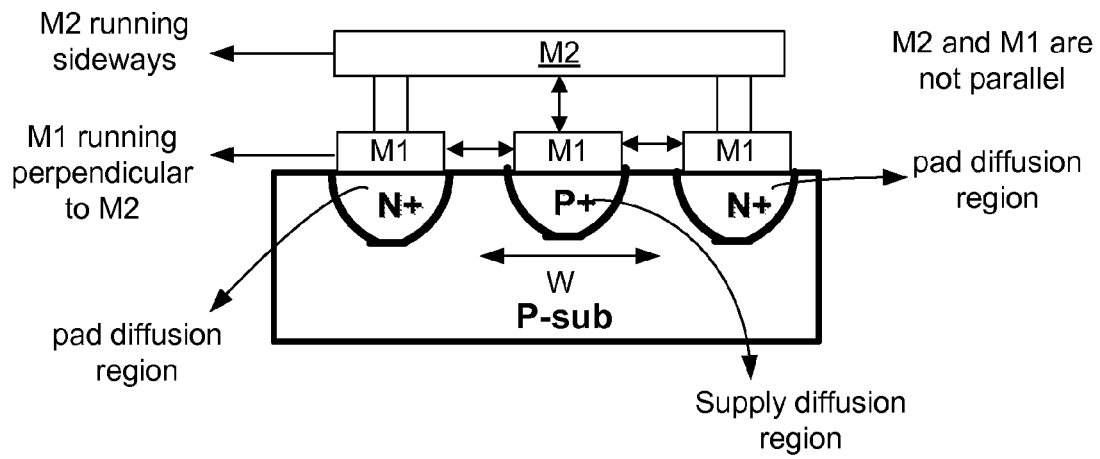
FIG. 3 is a cross-sectional view of a prior diode segment.

FIG. 3 illustrates a cross-section of a portion of the prior diode segment shown in FIG. 2 taken along the line A-B. While the diode portion shown in FIG. 3 includes n+ pad diffusion regions and a p+ substrate tap to Vss as may be used, for example, to provide the D1 diode of FIG. 1, it will be appreciated that similar issues apply to a D2 diode, for example, having a similar layout, but with p+ pad diffusion regions and an n+ well tap to Vcc and to other diodes.

Features of the exemplary prior diode layout approach shown in FIG. 2 may contribute to unnecessary capacitance. For example, referring to FIGS. 2 and 3, the use of minimum width stripes for the p-substrate (or n-well tap) (Vss or Vcc connection of D1 or D2 diodes, respectively) raises pad-to-supply capacitance. While this practice is efficient for packing density, with a contact on each stripe and minimum metal 1 (M1) overlap of the contact, the metal width equals the stripe width, and thus, the metal-to-metal sidewall capacitance may be considerable.

Further, portions of the metal 2 (M2) layer associated with the pad pass over terminals associated with the supply and vice versa, thereby enhancing pad-to-supply capacitance.

For the approach of FIGS. 2 and 3, while the horizontal diode stripes with vertical pickups in the M2 layer are area efficient and provide low resistance, the layout of FIG. 2 results in additional metal-to-metal capacitance as described. For some implementations, metal-to-metal capacitance may be the largest contributor to overall diode capacitance, as much as 70% for some example diodes according to some estimates.

Figure 4:
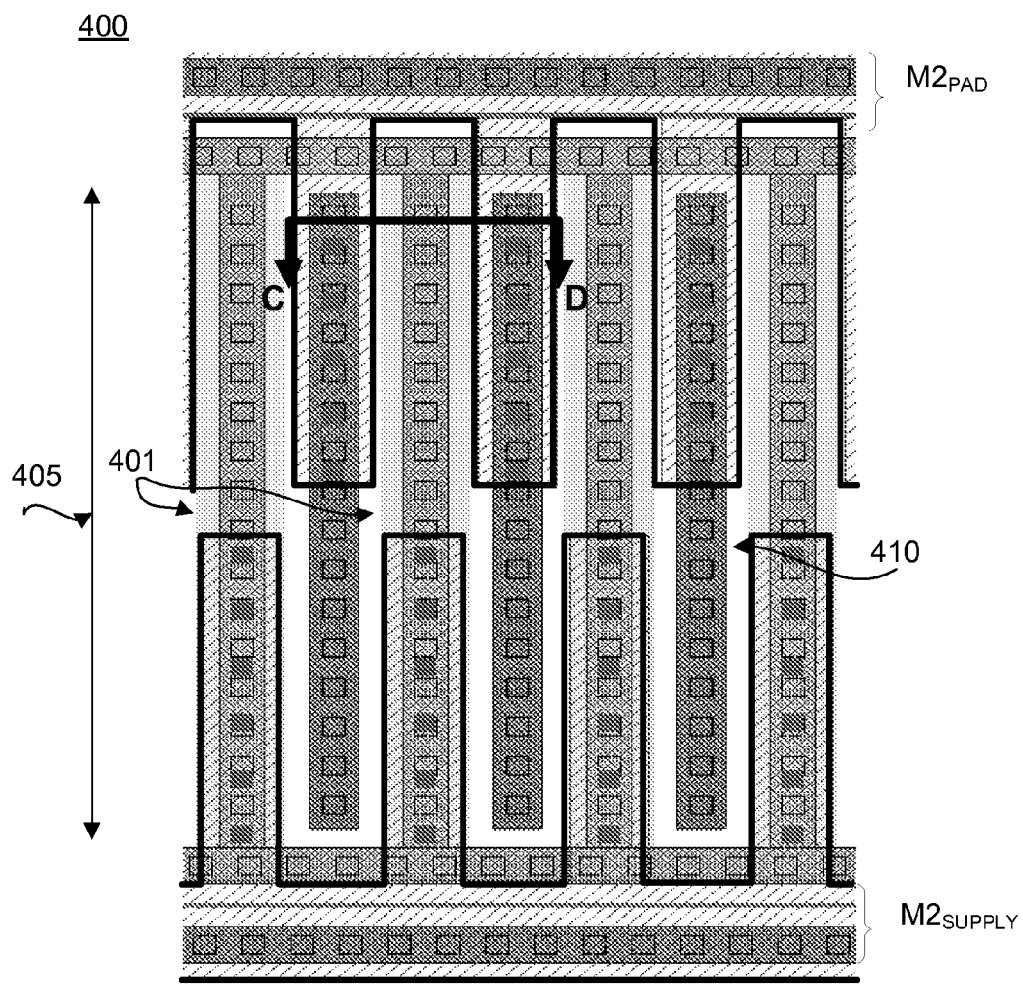
FIG. 4 is a plan view of a layout of a diode segment according to one embodiment.
Figure 5A:
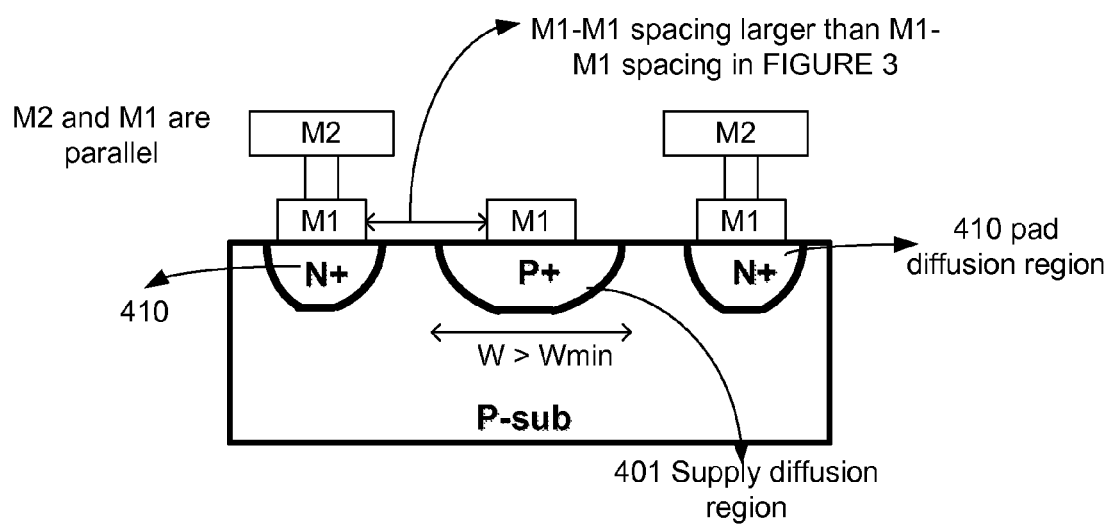
FIG. 5A is a cross-sectional view of a diode segment of one embodiment.
Figure 5B:
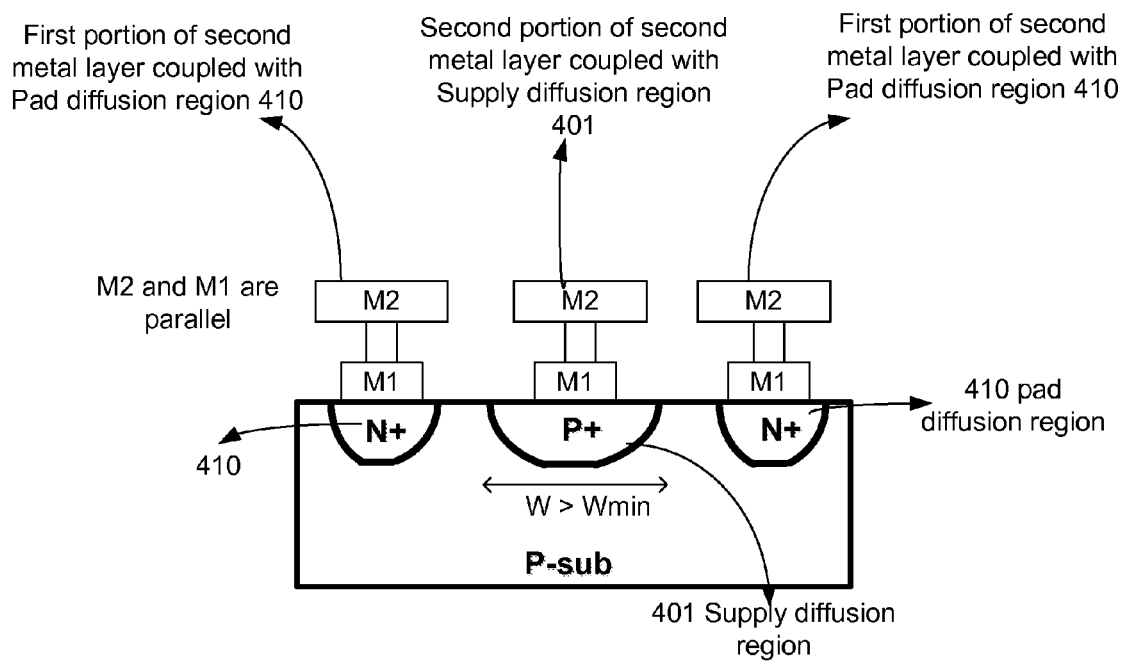
FIG. 5B is a cross-sectional view of a diode segment showing portions of the second metal layer, according to one embodiment of the invention.

FIG. 4 is a plan view of a diode segment 400 according to one embodiment showing an exemplary diode layout that may be used, for example to provide a D1 diode. FIG. 5 is a cross-sectional view of a portion of the diode segment 400 shown in FIG. 4 taken along the line C-D. It will be appreciated that a D2 diode with p+ pad diffusion regions and an n+ well-tap or other diode may be implemented using a similar layout.

In the description that follows, each of regions 401 and 410 shown in FIGS. 4 and 5, and similar regions for other embodiments, may be referred to generally as diffusion regions, or more specifically by the type of diffusion region. Further, the region 405 of the diode segment 400 (and of the overall diode of which the diode segment 400 is a part) that provides the functional portion of the diode is referred to herein as the diode region. Also, while metal 1 (M1) and metal 2 (M2) layers are described for purposes of example, it will be appreciated that, for other embodiments, a similar approach may be applied to other adjacent (i.e. conductive layers closest to each other) conductive layers.

For the exemplary layout of one embodiment shown in FIG. 4, the p-substrate taps 401 (only a sample few of which are identified with reference numbers) (or n+ well taps for other diode types) are widened substantially beyond a minimum width specified for the particular process on which the diode 400 is fabricated. Minimum width, as the term is used herein, refers to a minimum width associated with a particular process and may be determined by factors such as lithography and etching equipment capabilities, and quality and reliability-related considerations. For one embodiment, the taps 401 are at least 50% wider than the minimum width for the process, while the pad diffusion regions 410 may remain at a minimum or close to a minimum width. By widening the taps, the M1 to M1 capacitance may be substantially reduced by increasing the distance between adjacent M1 lines as shown in FIGS. 4 and 5.

The extent to which the substrate taps 401 (or n+ well taps) are widened in accordance with one embodiment may depend on a variety of factors such as, for example, the capacitance budget for the diode (or associated buffer) as described in more detail below, and area constraints. For one embodiment, for example, for one exemplary process, the taps may be widened such that spacing between adjacent M1 lines is increased from a minimum of about 0.26 um (microns) to about 0.48 um.

Because the power supply voltage does not change, the tap width does not contribute to capacitance. Further, for one embodiment, silicided junctions are provided on the diode 400 such that series resistance of the diode 400 does not increase substantially as a result of widening the taps 401 as shown.

In addition to widening the well-taps, in the diode region 405, the layout of the diode 400 is such that lines of the M1 and M2 layers are substantially parallel to each other. For the embodiment shown in FIGS. 4 and 5, for example, the lines of both the M1 and M2 layers in the diode region 405 are vertical. In this manner, M2 can still be used to lower resistance while eliminating crossovers in the diode region 401 that contribute to higher capacitance.

For the exemplary diode layout shown in FIGS. 4 and 5, the area of the M2 layer shown is divided into two portions: $M2_{PAD}$ and $M2_{SUPPLY}$. The $M2_{PAD}$ portion of the M2 layer, as the name suggests, is provided to couple pad diffusion regions 410 (only a representative few of which are indicated with reference numbers) to a pad related to, for example, an input buffer, while the $M2_{SUPPLY}$ portion of the M2 layer is provided to couple diffusion regions 401 (substrate taps) to receive a supply voltage (e.g. either Vcc or Vss).

As shown in FIG. 4, for one embodiment, each of the $M2_{PAD}$ and $M2_{SUPPLY}$ regions extends less than halfway across the diode region 405. In this manner, the separation between portions of the M2 layer that are coupled to the pad and portions of the M2 layer that are coupled to the supply is increased as compared to prior layouts, such that metal-to-metal capacitance may be reduced. For the particular example provided above, metal-metal capacitance may be reduced by about 47% resulting in a reduction in total capacitance (including constant differential capacitance) of about 33%. It will be appreciated that this is only an example and different results may apply to different embodiments.

Figure 6:
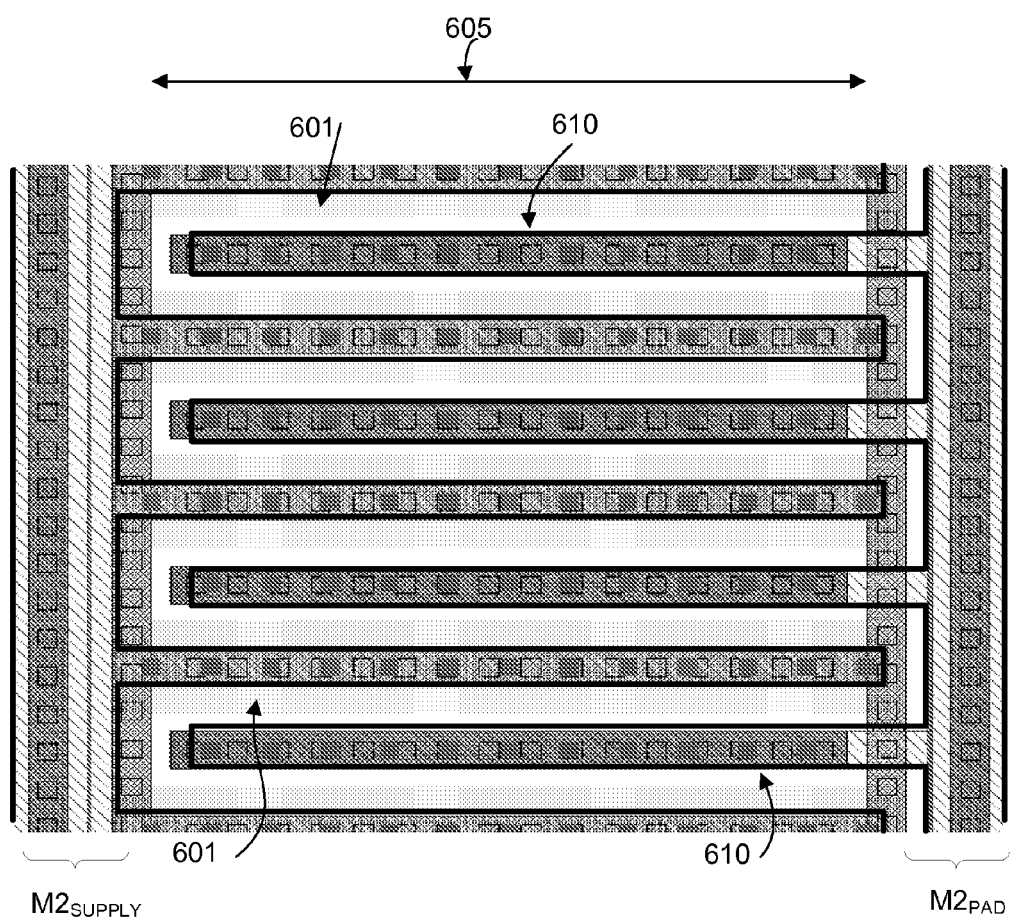
FIG. 6 is a plan view of a layout of a diode segment according to another embodiment.

For another embodiment, where area is less of a constraint, for example, the taps may be further widened such that lines of the $M2_{PAD}$ and $M2_{SUPPLY}$ regions may extend across substantially the entire diode region while still being separated from each other by a sufficient distance to meet a desired capacitance budget. As in the example embodiment described above, the pad regions may be substantially at a minimum width for the process. An example of such a layout is shown in FIG. 6 in which exemplary pad diffusion regions are identified with the reference number 610 and exemplary taps are identified with the reference number 601. As can be seen in FIG. 6, for one embodiment, the $M2_{SUPPLY}$ lines extend across the entire diode region 605, while the $M2_{PAD}$ lines extend across most of the diode region 605.

It will be appreciated that a diode with a layout as shown in FIG. 6 will have both M1 and M2 sidewall capacitance to consider and therefore, the taps 610 are widened further as shown to achieve reduced capacitance. For example, for a process as described above with a minimum spacing of about 0.26 um, the M1-M1 spacing may be increased, for example, to anywhere between about 0.68 um and about 1.26 um, with the well-tap widened to allow the extra space. For spacings of 0.68 um, the well-tap is widened less than for M1-M1 spacings of 1.26 um. For one embodiment in which the M1 and M2 lines extend across the entire width of the diode region, the width of the tap may be at least 100% larger than a minimum width for the tap.

The extent to which the capacitance may be reduced for this approach may be less than for the approach shown in FIGS. 4 and 5, (about 10% less in terms of total capacitance for the particular example given), but the layout of FIG. 6 may be preferable for some embodiments. It will be appreciated that the numbers above are provided for exemplary purposes only and that other widths may apply to other embodiments and/or to other processes and/or diode designs within the scope of various embodiments.

Figure 7:
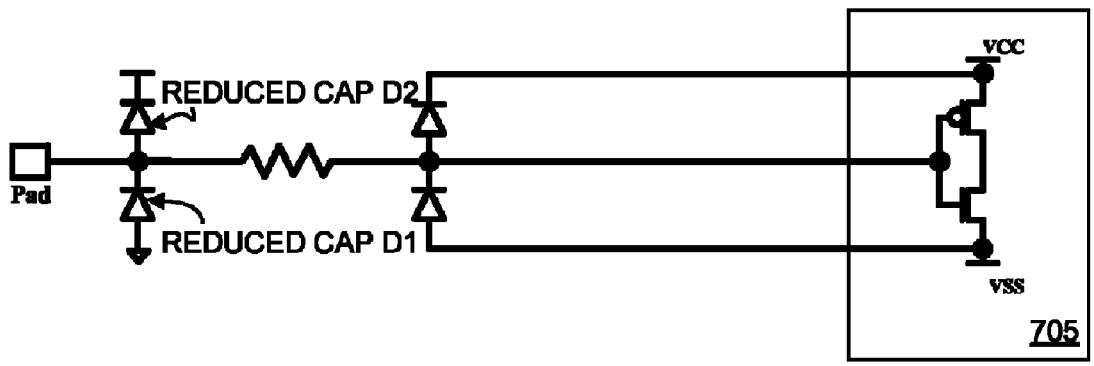
FIG. 7 is a schematic diagram showing an input buffer of one embodiment for which a diode according to FIG. 4 or FIG. 6 may be used.

A diode that has a layout according to one of the above-described embodiments may be used to provide one or more of the ESD protection devices D1 and/or D2 of FIG. 7, for example associated with input buffer 705. Alternatively, diodes in accordance with various embodiments may be used in a different type of circuit and/or for a different type of application.

For high-speed inputs there are two main properties of interest for, for example, the dual diodes D1 and D2 of FIG. 7: the conductance per unit of stripe length, and the capacitance (pad to power supply) per unit of stripe length. Using one or more of the above-described approaches it may be possible to reduce the capacitance per unit of stripe length for a particular conductance value. The particular amount by which the diode capacitance is reduced in accordance with various embodiments may be dependent upon a variety of factors including the particular process, including the particular type(s) of metal used for the M1 and M2 layer. For one exemplary process, the total capacitance per stripe length may be reduced by as much as 25%. Higher or lower reductions in capacitance may be associated with various embodiments and implementations.

Figure 8:
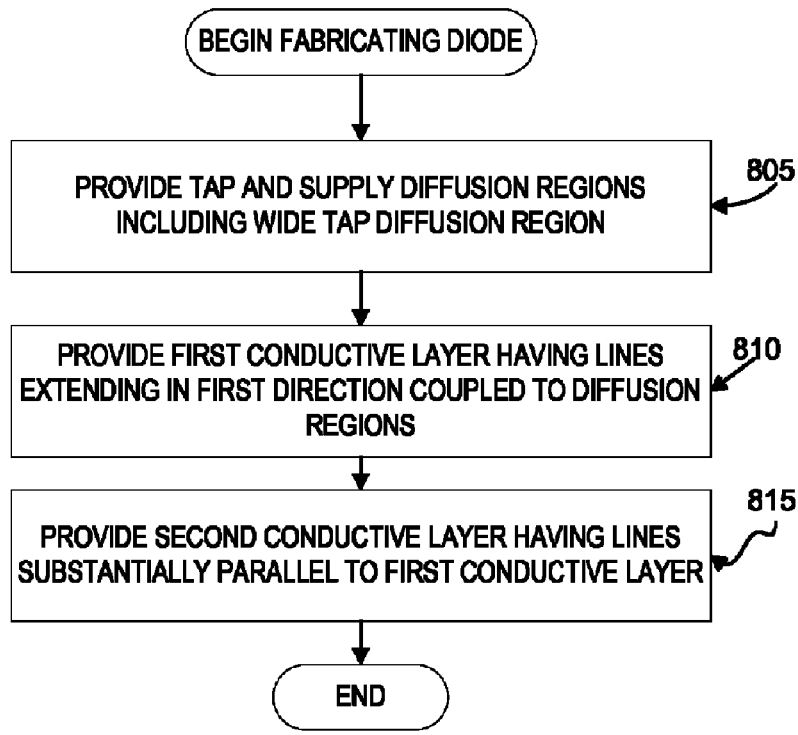
FIG. 8 is a flow diagram showing the method of one embodiment for laying out a diode.

Referring now to FIG. 8, a method of one embodiment for providing a diode is described. At block 805, diffusion regions are provided in a substrate including a tap diffusion region that is wider than a minimum width for the tap diffusion region. At block 810, a first conductive layer is provided (i.e. deposited and patterned) having lines that extend in a first direction (e.g. either horizontally or vertically), the first conductive layer being coupled to the diffusion regions. At block 815, a second adjacent conductive layer is provided (i.e. deposited and patterned), the second conductive layer having lines that are substantially parallel to the lines of the first conductive layer.

It will be appreciated that, for other embodiments, additional actions may be included and/or not all of the actions described may be included.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus comprising:
   a first conductive layer to provide conductive interconnects for pad diffusion regions and supply diffusion regions in a diode; and
   a second conductive layer coupled with the first conductive layer, the second conductive layer including a first portion to couple the pad diffusion regions with a pad and a second portion to couple the supply diffusion regions with a voltage supply,
   wherein the first and the second conductive layers having conductive lines being parallel to each other in a diode region of the diode,
   wherein the first portion of the second conductive layer extends less than half way across the diode region from a first side of the diode region, and
   wherein the second portion of the second conductive layer extends less than half way across the diode region from an opposite side of the diode region.

2. The apparatus of claim 1, wherein the supply diffusion regions having a width which is larger than a minimum width associated with the supply diffusion regions for a process technology on which the diode is manufactured.

3. The apparatus of claim 1, wherein the pad diffusion regions having a minimum width associated with the pad diffusion regions for a process technology on which the diode is manufactured.

4. The apparatus of claim 1, wherein each of the first and the second portions of the second conductive layer includes conductive lines that extend across the entire diode region.

5. A diode comprising:
   a first supply diffusion region having a width that is larger than a minimum width associated with supply diffusion regions for a process technology on which the diode is manufactured;
   a first metal layer to provide interconnects for pad diffusion regions and supply diffusion regions including the first supply diffusion region; and
   a second metal layer including a first portion to couple the pad diffusion regions with a pad, and a second portion to couple the supply diffusion regions with a voltage supply,
   wherein the first and the second metal layers having metal lines being parallel to each other in a diode region of the diode, and
   wherein the first and second portions of the second metal layer having metal lines to extend across less than 50% of the diode region from opposite sides of the diode region.

6. The diode of claim 5, wherein the pad diffusion regions have a width equal to a minimum width for the pad diffusion regions associated with the process technology on which the diode is fabricated.

7. The diode of claim 5, wherein the first and second portions of the second metal layer having metal lines to extend across an entire width of the diode region and the width of the supply diffusion region is at least 100% larger than a minimum width for the supply diffusion region.

* * * * *